United States Patent
Van Hoften et al.

(10) Patent No.: US 8,618,498 B2
(45) Date of Patent: Dec. 31, 2013

(54) BACKSCATTER REDUCTION IN THIN ELECTRON DETECTORS

(75) Inventors: Gerrit Cornelis Van Hoften, Veldhoven (NL); Michael Alwin William Stekelenburg, Vught (NL); Richard Henderson, Cambridge (GB); Gregory James McMullan, Cambridge (GB); Abdul Raffey Faruqi, Cambridge (GB); Renato Andrea Danilo Turchetta, Oxford (GB); Nicola Carlo Guerrini, Didcot (GB); Joeri Lof, Eindhoven (NL); Frank Jeroen Pieter Schuurmans, Valkenswaard (NL)

(73) Assignee: FEI Company, Hillsboro, OR (US)

( * ) Notice: Subject to any disclaimer, the term of this patent is extended or adjusted under 35 U.S.C. 154(b) by 170 days.

(21) Appl. No.: 13/197,632

(22) Filed: Aug. 3, 2011

(65) Prior Publication Data

US 2012/0032078 A1    Feb. 9, 2012

Related U.S. Application Data

(60) Provisional application No. 61/370,737, filed on Aug. 4, 2010.

(30) Foreign Application Priority Data

Dec. 7, 2010  (EP) .................................. 10193887

(51) Int. Cl.
*H01J 37/244* (2006.01)
(52) U.S. Cl.
USPC ........................................... 250/397; 250/311
(58) Field of Classification Search
USPC .......................... 250/311, 397, 307
See application file for complete search history.

(56) References Cited

U.S. PATENT DOCUMENTS

| | | |
|---|---|---|
| 5,635,720 A | 6/1997 | Mooney et al. |
| 6,194,719 B1 | 2/2001 | Mooney et al. |
| 6,285,018 B1 | 9/2001 | Aebi et al. |
| 6,414,309 B2 | 7/2002 | Mooney et al. |
| 7,845,245 B2 | 12/2010 | Hayles et al. |
| 7,851,769 B2 | 12/2010 | Schmid et al. |
| 2003/0151002 A1 | 8/2003 | Ito et al. |
| 2006/0278943 A1 | 12/2006 | Turchetta et al. |

OTHER PUBLICATIONS

Faruqi, et al., "Electronic Detectors for Electron Microscopy," Current Opinion in Structural Biology, Oct. 29, 2007, pp. 549-555, vol. 17, No. 5.

G McMullan, et al., "Experimental Observation of the Improvement in MTF from Backthinning a CMOS Direct Electron Detector," Ultramicroscopy, Aug. 1, 2009, pp. 1144-1147, vol. 109, No. 9, Elsevier LTD.

Battaglia, Marco, et al., "Characterisation of a CMOS Active Pixel Sensor for use in the TEAM Microscope," Jun. 13, 2010, 19 pages, http://arxiv.org/abs/1006.2544v1.

(Continued)

*Primary Examiner* — Nikita Wells
*Assistant Examiner* — Johnnie L Smith
(74) *Attorney, Agent, or Firm* — Scheinberg & Associates, PC; Michael O. Scheinberg

(57) ABSTRACT

In a direct electron detector, backscattering of electrons into the detector volume from below the sensor is prevented. In some embodiments, an empty space is maintained below the sensor. In other embodiments, a structure below the sensor includes geometry, such as multiple high aspects ratio channels, either extending to or from the sensor to trap electrons, or a structure of angled surfaces to deflect the electrons that pass through the sensor.

10 Claims, 6 Drawing Sheets

(56) References Cited

OTHER PUBLICATIONS

"Centre for Instrumentation, 2001—2003", http://www.efi.circ.ac.uk/reports/CFIB-p05-03.pdf, Jun. 2003, 42 pgs.

Daberkow, I., et al., "Performance of Electron Image Converters with YAG Single-Crystal Screen and CCD Sensor," Ultramicroscopy, Dec. 1991, pp. 215-223, vol. 38, Nos. 3/4.

Deptuch, G., et al., "Simulation and Measurements of Charge Collection in Monolithic Active Pixel Sensors," Nuclear Instruments and Methods in Physics Research A, 2001, pp. 92-100, vol. 465.

Fossum, E. R., "Active Pixel Sensors: Are CCD's Dinosaurs?" Proceeding of SPIE, Feb. 2, 1993, pp. 2-14, vol. 1900.

Fuchs, E., et al., Particle Beam Microanalysis: Fundamentals, Methods and Applications, 1990, pp. 42-45, VCH Verlagsgesellschaft mbH.

Joy, David C., Monte Carlo Modeling for Electron Microscopy and Microanalysis, 1995, pp. 96-97, Oxford University Press.

Prydderch, M. L. et al., "A 512×512 CMOS Monolithic Active Pixel Sensor with Integrated ADCs for Space Science," Nuclear Instruments and Methods in Physics Research A, Jul. 2003, pp. 358-367, vol. 512, No. 1-2.

Turchetta, R. et al., "A Monolithic Active Pixel Sensor for Charged Particle Tracking and Imaging Using Standard VLSI CMOS Technology," Nuclear Instruments and Methods in Physics Research A, Feb. 11, 2001, pp. 677-689, vol. 458, Issue 3.

BACKSCATTER REDUCTION IN THIN ELECTRON DETECTORS

This application claims priority from U.S. Provisional Patent Application 61/370,737, filed Aug. 4, 2010, which is hereby incorporated by reference.

TECHNICAL FIELD OF THE INVENTION

The present invention relates to improving resolution in electron detectors for transmission electron microscopy.

BACKGROUND OF THE INVENTION

In the early '90s, CMOS Monolithic Active Pixel Sensors (MAPS) were invented for the detection of visible light. Because of continuous improvements in CMOS technology, CMOS sensors are becoming the dominant image-sensing device, in commercial digital cameras and scientific applications.

CMOS MAPS were also proposed and demonstrated as charged particle detectors, first for particle physics, and then for other applications, such as transmission electron microscopy. The electron energies in a transmission electron microscope ("TEM") typically range from about 100 keV up to about 500 keV. TEMs commonly use charged-couple device ("CCD") detectors, which are damaged by high energy electrons. To prevent damage to the CCD detector, TEM detectors include a scintillator that converts the electrons to light, which is then detected by the CCD. The intervening scintillator reduces resolution of the detector. CMOS MAPS can be used as direct detectors of charged particles, that is, the CMOS MAPS are more robust and can detect the electrons directly.

CMOS MAPS can provide a good signal-to-noise ratio, high resolution and high sensitivity, and are a significant improvement over current CCD technology using scintillators. CMOS MAPS include a thin epitaxial layer over a thicker substrate. Substantially all of the detection occurs in the epitaxial layer, which provides the detection volume. One problem with electron detectors is that electrons which are backscattered from the substrate below the detector volume can return into the detector volume, randomly increasing the signal and spreading the signal over multiple pixels. Performance of the CMOS MAPS can be improved if electron backscattering could be prevented. A known method of reducing backscattering is to thin the substrate below the detector volume, which is referred to as backthinning. High energy electrons are then more likely to pass completely through the thinned substrate without backscattering. Ninety percent of the silicon substrate of a CMOS APS does not contribute to the performance of the detector but the substrate does contribute to backscatter which reduces signal to noise ratio and blurs the image.

FIG. 1 shows Monte Carlo simulations of scattering of a 300 keV primary electron 102 in a 300 μm thick silicon sensor 104. The traces 106 represent different possible electron trajectories as determined by the simulation. The trajectory that an individual electron follows is determined by chance. Only a few of the many possible trajectories that the electron could follow are shown. A line 108 is drawn about 35 μm below the top surface, the depth to which a typical sensor may be backthinned. The sensitive volume of the sensor is the top layer 110, approximately 5 μm to 20 μm thick.

Traces 106 show the electron trajectories when a sensor is not backthinned. Traces 116 show that some of the electrons being scattered within sensor 104 back into the sensitive top layer 110. Such backscattered electrons degrade the resolution of the sensor by producing extraneous signals, many of which are away from the impact point of the primary electron 102. With the sensor backthinned to line 108, relatively few electrons are backscattered within the thinned substrate to the sensitive top layer 110, so resolution of the sensor is improved. In a thick sensor, substantial signal could be generated at a large distance from the impact point of the primary electron 102. A thin sensor can therefore greatly improve the detector performance.

SUMMARY OF THE INVENTION

An object of the invention is to provide a camera for improved electron detection.

Embodiments of this invention provide improved camera performance by reducing the effect of backscattered electrons. Electrons that pass through a thin sensor may still have sufficient energy to be scattered from material below the sensor back into the sensor and degrade the detector signal. Some embodiments remove some or all of the material below a thin detector substrate to prevent scattering electrons back into the detector volume. Some embodiments provide a structure below the sensor that prevents electrons from backscattering into the detection volume. Such structures can prevent backscattering into the detection volume by incorporating a geometry that scatters electrons in a direction that prevents them reaching the sensor; by having a low backscattering coefficient; or by a combination of geometry and material properties.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Electrons are backscattered not only by the detector substrate, but also by materials below the detector substrate. The term "below the sensor" is used herein to mean "downstream" or further along in the direction of electron motion from the sensor, regardless of whether the electrons move vertically or horizontally in the camera. The primary beam of high-energy electrons will pass through a thin sensor and may scatter on material below the sensor back into the sensor and degrade the detector resolution. As the sensor is made thinner to reduce scattering in the sensor substrate, more electrons pass through the sensor with higher energies and the problem of backscattering from below the substrate is exacerbated. Various embodiments of the invention prevent backscattering of electrons from structures below a sensor. "Prevent backscattering" is used to mean to eliminate or to greatly reducing the amount of backscattering, and does not require that there be no possibility of backscattering. A "thin" sensor means one in which a significant percentage, that is, greater than ten percent, of the incoming electrons pass through the sample and exit the back side. Whether a sensor is "thin" in a particular application depends in part on the energy of the incoming electrons and the material of which the sensor is made. A typical silicon sensor for a TEM has a pixel size between about 5 µm and 50 µm. The sensor thickness includes the thickness of an electron-sensitive detector volume and the thickness of a substrate volume that provides mechanical support for the detector volume. A sensor that is thinner than about 100 µm is a "thin" sensor in most applications, although preferred sensors are less than about 50 µm, less than about 35 µm, or less than about 25 µm. In theory, the sensor substrate volume could be complete removed, leaving only a detector volume between 5 µm and 20 µm thick.

Figure 1:
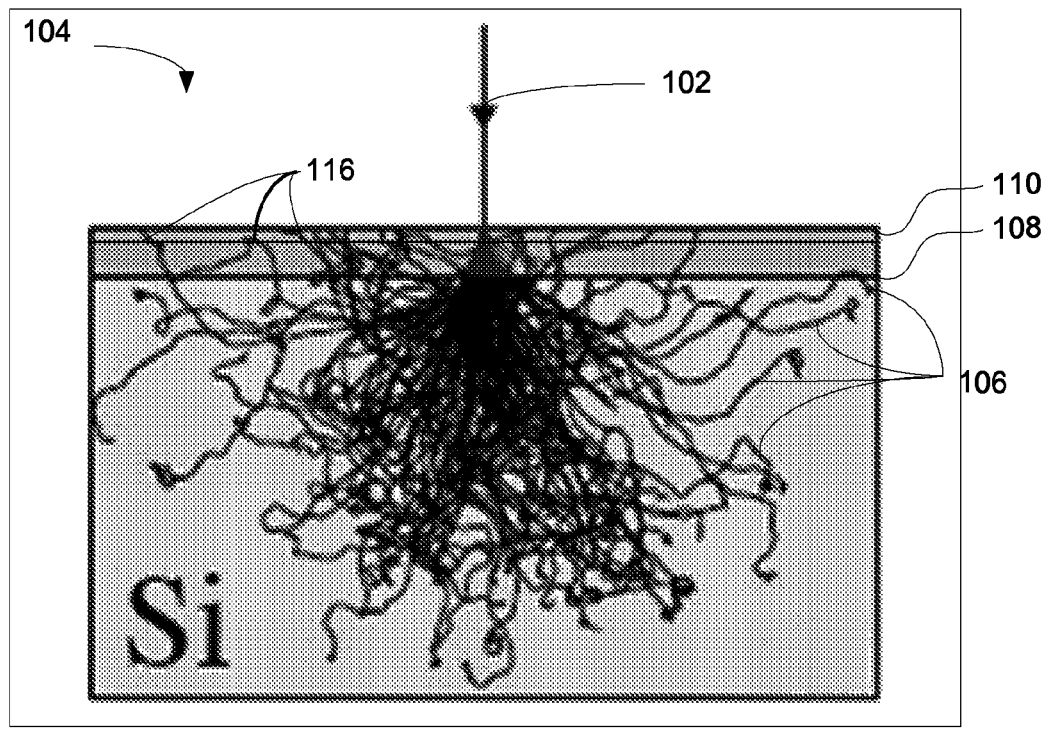
FIG. 1 shows a Monte Carlo simulation of 300 keV electron tracks in a silicon electron detector.
Figure 2:
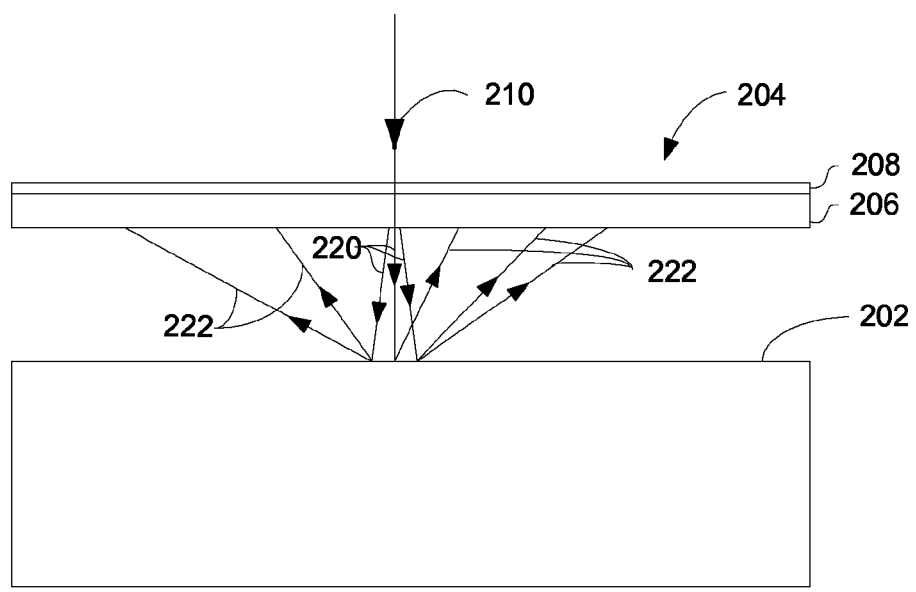
FIG. 2 shows a few possible trajectories of electrons passing through a sensor and backscattering from a material relatively near the bottom of the sensor.

FIG. 2 shows the effect of a material in the camera bottom 202 that is below a backthinned detector 204 having a substrate 206 and a sensitive detector volume 208. FIG. 2 shows a few of the possible trajectories 220 that an electron might take after passing through the backthinned sensor 204. An electron following one of the trajectories 220 can be backscattered by the camera bottom 202 and might take one of the trajectories 222 and return and strike the detector 204. If the returning electron has sufficient energy to reach the detector volume 208, it can cause an erroneous signal. It will be understood that the path of any individual electron is impossible to predict and the trajectories 220 and 222 shown represent only a few of the possible paths. In accordance with a preferred embodiment of the invention, the volume below the detector is either empty of material or any material present is configured to reduce backscattering, either by its geometry or by its composition.

Figure 3:
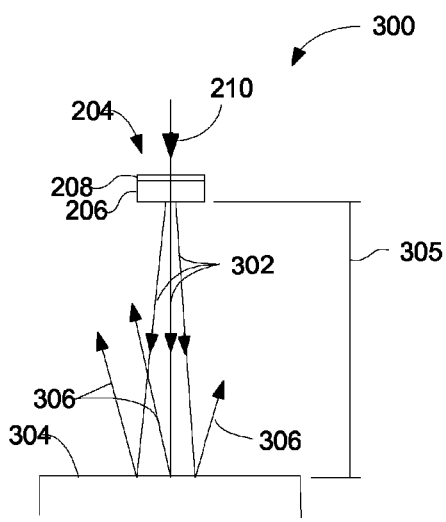
FIG. 3 shows a few possible trajectories of electrons passing through a sensor and backscattering from a material relatively far below the bottom of the sensor.

FIG. 3 shows that if a camera 300 has no material sufficiently close below sensor 204, most electrons that pass through the sensor will not be backscattered into the sensor 204. FIG. 3 shows three example trajectories 302 of an electron 210 that passes through sensor 204, and is then scattered from a material 304 at a relatively large distance 305 below the bottom of sensor 204. Trajectories 306 show a few of the possible trajectories after scattering. Electrons are scattered at angles between zero and ninety degrees. As the size of the gap between the camera floor 304 and the sensor 204 increases, the geometry makes it less likely that the backscattered electron will return and strike the detector 204. For example, backscattered electrons following trajectories 306 would not return and strike detector 204, as did electrons following trajectories 222 of FIG. 2. In some preferred embodiments, the material below the sensor is positioned at a distance of more than four times the largest linear surface dimension, such as length, width, or diameter, of the sensor to substantially reduce backscattering of electrons into the sensor 204. For example, in a rectangular sensor, the distance between the sensor bottom and the nearest material is preferably more than four times the longer of the sensor length or width. In other embodiments, a distance of more than two times the largest dimension, more than three times the largest dimension, or more than five times the largest dimension is used.

In some preferred embodiments, the bottom of the detector, or the material below the detector, can be covered with a material that moderates backscatter, such as a material having a low atomic number. For example, beryllium, having an atomic number of nine; carbon, having an atomic number of twelve; or any material having an atomic number less than that of silicon (twenty-eight), will reduce the backscattering of the electrons. Compounds, such as hydrocarbons, that have a relatively high hydrogen content have a low average Z and will reduce backscattering.

Figure 4:
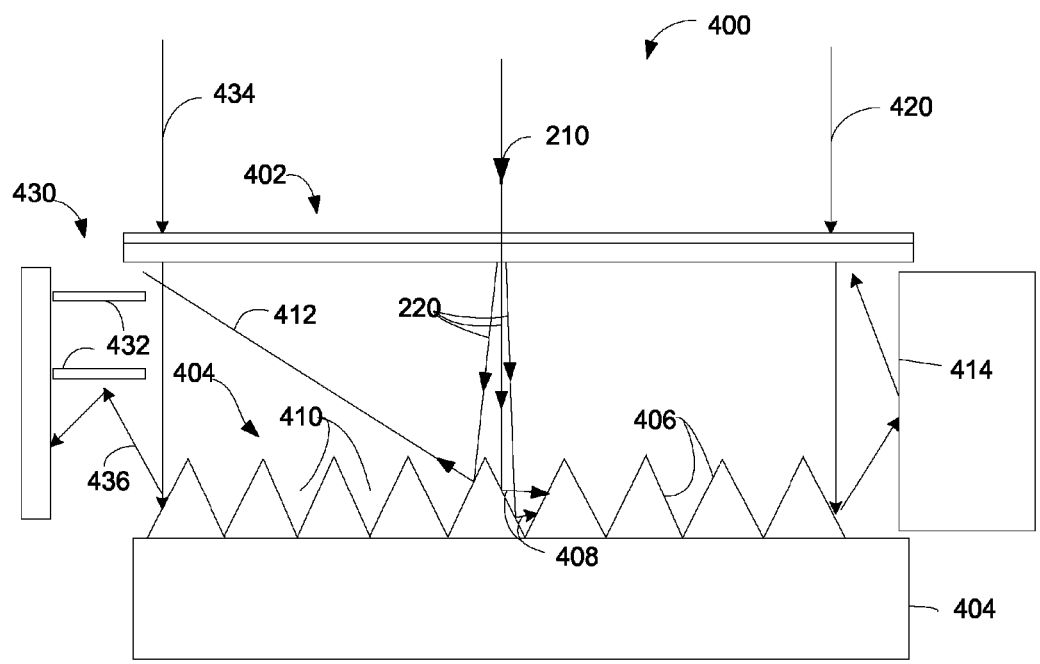
FIG. 4 shows an embodiment of the invention in which the geometry of the camera bottom prevents backscattering to the detector volume.

In some embodiments of the invention, the camera bottom below the detector provides structural features whose shapes prevent electrons from backscattering into the detector. For example, FIG. 4 shows a camera 400 that includes a sensor 402 and a camera bottom 404 that is formed into a series of sloped surfaces 406, such as ridges or pyramids. FIG. 4 shows a few of the possible trajectories 220 of an electron that passes through sensor 402. In two of the illustrated trajectories of FIG. 4, the electron 210 strikes sloped surface 406 and follows a trajectory 408 deeper into one of grooves 410 defined by sloped surfaces 406 and away from sensor 402. After multiple collisions, the electrons lose energy, are absorbed into the camera bottom 404, and are conducted away. In another possible trajectory 412, the electron is back scattered from sloped surface 406 away from detector 402. The preferred depth of grooves 410 and the angle of sloped surface 406 can be optimized for a particular camera geometry to maximize attenuation of backscattering within physical constraints of the camera.

FIG. 4 also shows, on the right side of camera 400, that a primary electron 420 that impinges near the edge of camera 400 could be scattered by a camera side wall 414 back into sensor 402. This backscatter can be prevented, for example, as shown on the left side of camera 400 by a wall structure 430 that includes fins 432 or some other barrier. Fins 432 may be horizontal or may extend at an angle, preferably a downward angle, to direct scattered electrons away from sensor 402. When a primary electron 434 passes through sensor 402 and is scattered off an angled surface 406 toward the side of the camera along a trajectory 436, the backscattered electron strikes one of fins 432 and does not reach the detector 402.

Figure 5:
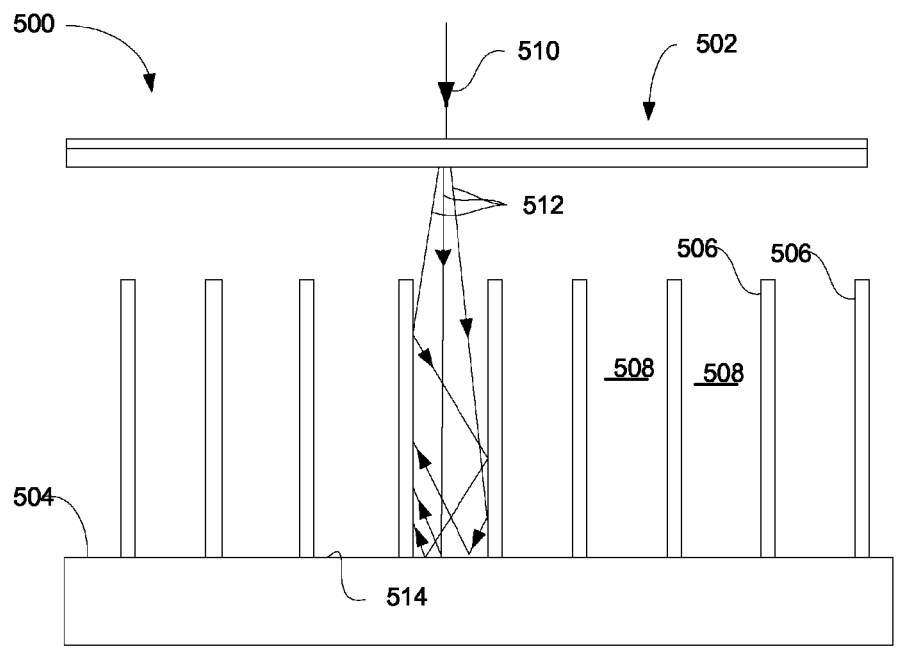
FIG. 5 shows another embodiment of the invention in which the geometry of the camera bottom prevents backscattering to the detector volume.

FIG. 5 shows another camera 500 that includes a sensor 502 and a camera bottom 504 that includes multiple vertical fins 506. The vertical fins 506 form high aspect ratio channels 508. High aspect ratio in this context and that of other embodiments means an aspect ratio greater than 1, more preferably greater than 2 and most preferably greater than 5. The embodiment of FIG. 5 takes advantage of the fact that most electrons are backscattered at an angle, rather than straight back at 180°. FIG. 5 shows a primary electron 510 passes through detector 502 and follows one of trajectories 512. Some of the electrons that strike the flat portions 514 of camera bottom 504 are backscattered from camera bottom 504. When scattered at an angle they strike the surface of one of the fins 506. After multiple strikes of the fins, the electrons lose energy and are absorbed. Some electrons that exit sensor 502 at an angle strike the sidewalls of fins 506 and ricochet within channels 508 until they lose energy. That is, electrons passing the sensor 502 will get trapped in one of the channels 508. The channels 508 could be fabricated using materials commonly used in aerospace construction, such as honeycomb aluminum sheets, or with channel plates, such as those used in a channel plate detectors. The channels 508 can be aligned with the pixels of sensor 502 so that the few electrons backscattered from the tops of vertical fins 506 will have minimal effect on the detector signal. The tips of vertical fins 506 can be tapered to a point to further reduce backscattered electrons reaching sensor 502. In some embodiments, fins 506 are between about 1 mm and 20 mm high and are spaced apart by between 50 μm and 2000 μm. The tops of fins 506 are preferably between about 0 mm and 50 mm below sensor 502. The preferred size of the fins or other backscatter reducing geometric features to reduce backscattering will vary with the size of the sensor and the camera geometry. Any channel structure may reduce backscattering, and optimum dimensions can be determined experimentally or by using simulations for any particular sensor geometry.

Figure 6:
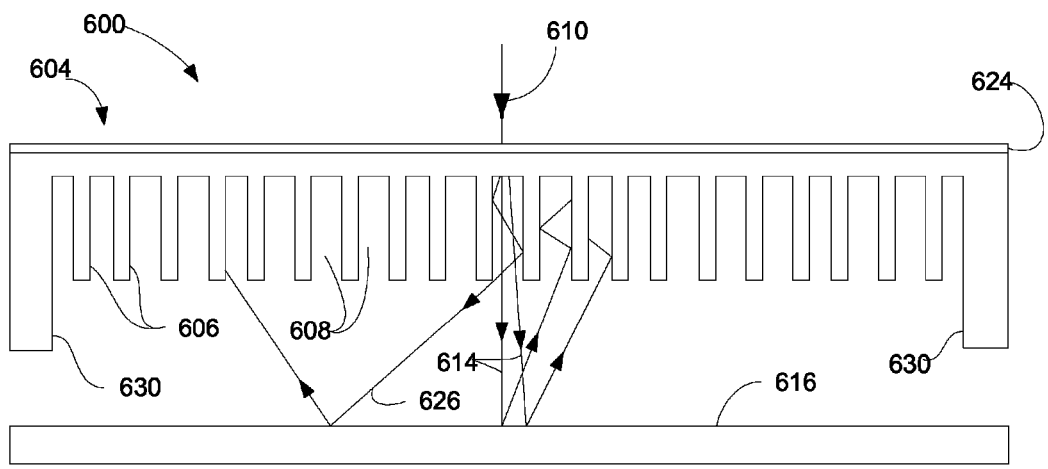
FIG. 6 shows another embodiment of the invention in which the geometry of the backside of the sensor prevents backscattering to the detector volume.

FIG. 6 shows another embodiment of the invention in which a camera 600 includes a sensor 604 having fins 606 that form high aspect ratio channels 608 in the backside of the sensor itself. Rather than uniformly thinning the backside of sensor 604, channels 608 are etched in the backside, for example, by photolithography. Alternatively, a finned or channel structure can be bonded or otherwise attached to a thin sensor structure. FIG. 6 shows that a primary electron 610 that passes through sensor 604 and follows one of trajectories 614 is scattered at an angle from striking camera bottom 616 and strikes fins 606 multiple times. The electron loses sufficient energy, similar to the way electrons are absorbed by the fins 506 of FIG. 5, so that the electron is unlikely to reach the sensitive detector volume 624 in sensor 604. Some electrons are scattered at greater angle within sensor 604 and follow a trajectory 626 that strikes a fin 606 before striking camera floor 616. Besides reducing the number of backscattered electrons, the fins 606 also provides mechanical strength. In some embodiments, a thicker or deeper supportive edge 630 of solid silicon or other material is left around the sensor 604 when the channels 608 are etched to provide additional mechanical strength. In some embodiment, channels 608 are between about 10 μm and 2000 μm deep and are spaced apart by between 10 μm and 2000 μm. The bottoms of fins 606 are preferably positioned between about 0 mm and 50 mm above camera bottom 616.

Because of the additional support provided by the fins 606, sensor 604 can be made thinner, for example, less than 30 μm, because the thinned portions have to bridge a much smaller span, in some embodiments, only tens of microns instead of tens of millimeters. The thinner sensor will further reduce backscattering within the substrate. The channels 608 are preferably aligned with the pixel wells, to minimize the effect on the detector signal from backscattering from the thicker portions of the detector substrate at fins 606.

Figure 7:
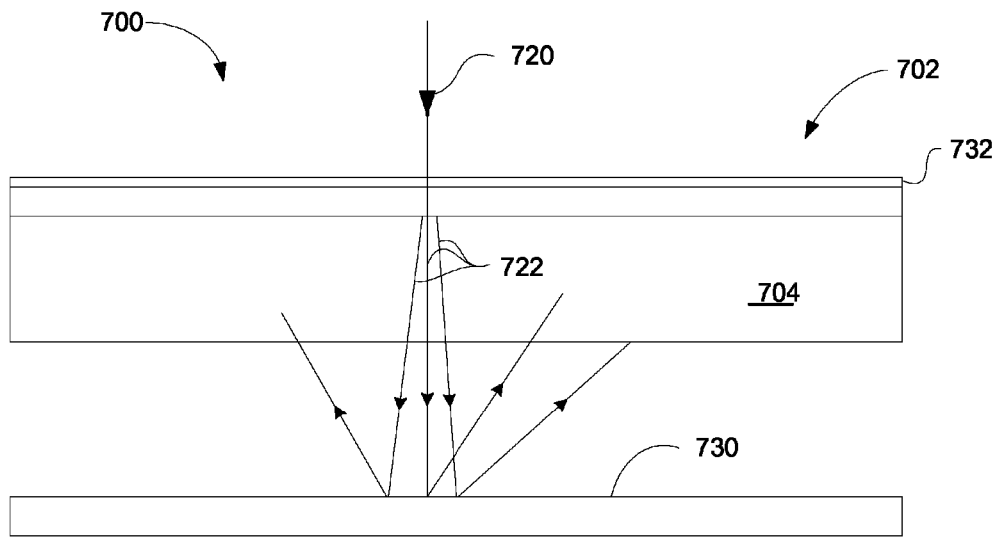
FIG. 7 shows another embodiment of the invention in which a material of the backside of the sensor prevents backscattering to the detector volume.

FIG. 7 shows another camera 700 in which resolution is improved by reducing electron backscattering from below the sensor substrate. The backside of a sensor 702 is coated with a layer 704 of material that reduces backscattering. For example, the material of layer 704 could have a low backscatter coefficient, which is typical of materials having low average atomic numbers, including hydrocarbons such as bees wax, or a sheet of low density material, such as reticulated ventricular carbon ("RVC"). This embodiment also has the advantage of providing structural support for the thin detector 702. Additional supports allow the detector to be made thinner than would be possible without the support. In one embodiment, a one millimeter layer of RVC reduces the number of backscattered electrons reaching the detection volume of detector 702. Material 704 should be vacuum compatible, that is, have a low vapor pressure. A thin layer of a high Z material may be used to cover and protect a higher vapor pressure material, such as a hydrocarbon, from the vacuum. As long as the high Z layer is thin, for example, less than 50 μm, the increased backscatter will be within acceptable levels for many applications. Primary electron 720 passes through sensor 702 following one of the trajectories 722. With some materials, such as hydrocarbons, as electrons following trajectories 722 pass through material 704, they lose energy. Electrons that are backscattered by camera bottom 730 pass again into material 704 where they lose sufficient energy so that most do not reach the detector volume 732.

Figure 8:
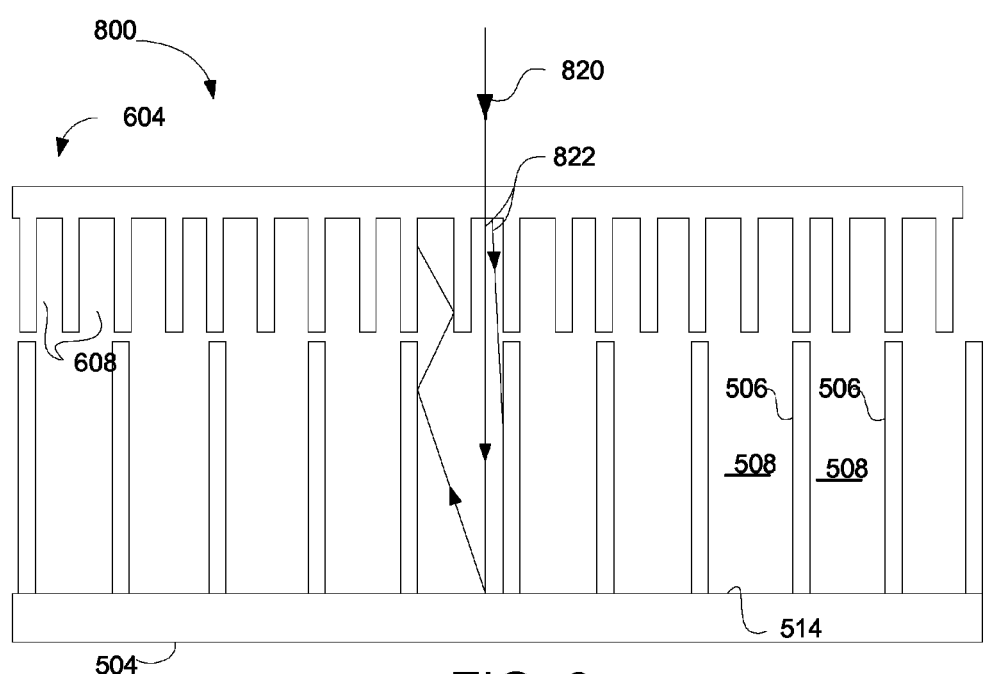
FIG. 8 shows another embodiment of the invention, similar to a combination of the structures shown in FIGS. 5 and 6, in which the geometry of the camera bottom prevents backscattering to the detector volume.

FIG. 8 shows a camera 800 that includes a combination of the embodiments of FIGS. 5 and 6. The camera of FIG. 8 includes a sensor 604 having channels 608. Below sensor 604 is a camera bottom 504 that includes multiple vertical fins 506 that define channels 508. The camera bottom 504 or the sensor 602 could also include within the channels a material that reduces backscattered electrons, such as the materials described with respect to FIG. 7.

A primary electron 820 passing through the detector 604 and following one of 822 trajectories ricochets and is absorbed in channels 608 and 508, as described with respect to FIGS. 5 and 6.

Figure 9A:
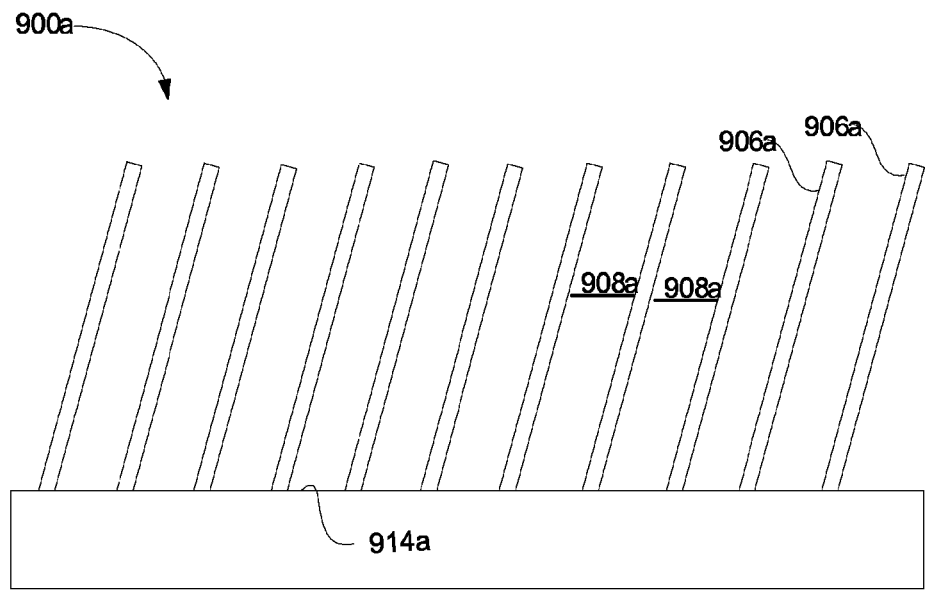
FIGS. 9A and 9B show other embodiments of the invention in which the geometry of the camera bottom prevents backscattering to the detector volume.
Figure 9B:
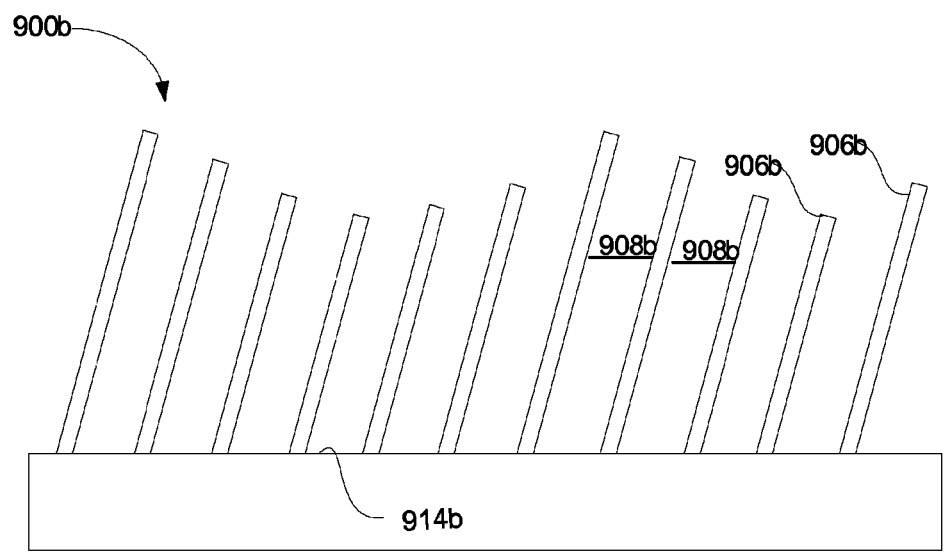

FIGS. 9A and 9B shows additional embodiments of structures for reducing electron backscatter downstream from a thin sensor. FIG. 9A shows a structure 900a that includes angled fins 906a having between them spaces 908a. The angle of the fins 906a is preferably sufficient to prevent electrons from the sensor from directly impacting camera bottom 914a. Electrons that pass through the sensor are scattered from the sides of angled fins 908a and are effectively trapped in structure 900a. The tops of angled fins 906a can be angled with respect to the bottom surface of the sensor to prevent backscatter from the tops of the fins. The structure 900b of FIG. 9B is similar to structure 900a of FIG. 9A, but angled fins 906b vary in height. As in structure 900a, electrons passing through the sensor become trapped in spaces 908b between angled fins 906b.

Figure 10:
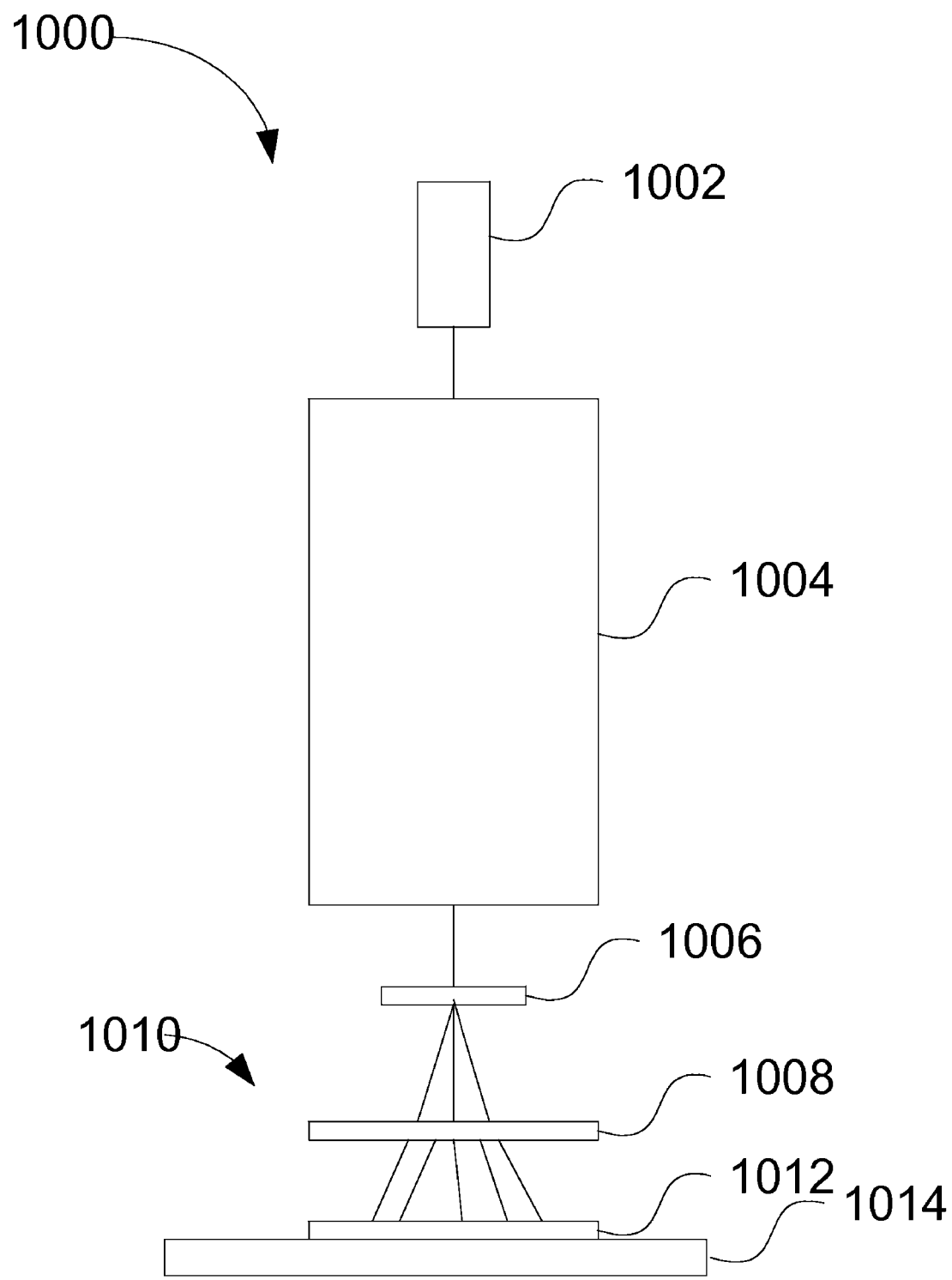
FIG. 10 shows a transmission electron microscope that incorporates an embodiment of the invention.

FIG. 10 shows a simplified block diagram of a transmission electron microscope 1000 that embodies the invention. Microscope 1000 includes a source of electrons 1002 and a focusing column 1004 that focuses a high energy beam of electrons onto a sample 1006. Electrons passing through the sample 1006 are detected by a thin sensor 1008 of a camera 1010. Structure 1012 improves detector resolution by preventing backscatter of electrons back into sensor 1008 from scattering from camera floor 1014. Some of the possible embodiments of structure 1010 are described in FIGS. 3-8 above. There are many known configurations of transmission electron microscopes, and the invention can be used on any microscope that includes a thin sensor. For example, embodiments of the invention can be used with a microscope having an energy filter for energy loss spectroscopy or for forming an energy filtered image.

While several embodiments have been separately described, skilled persons will recognize that the various structures described to reduce backscattering can be combined in various ways to reduce backscattering without departing from the principals of the invention. For example, the camera bottom surface could comprise an irregular, rough surface to reduce backscattering instead of a regular geometric pattern as described above. Any deviation from a smooth surface will reduce backscattering. By "camera bottom" is meant the portion of the camera downstream of the sensor, and is not limited to the bottom vacuum chamber wall or any particular component. All dimensions in the embodiments above are provided by way of example, and the dimensions of the various structures to prevent backscattering will be varied depending on the characteristics, such as sensor size, of each camera. While a "backthinned" sensor is referenced in some of the embodiments above because of current manufacturing techniques, the invention is applicable to any thin sensor, and is not limited to a sensor that is originally thick and is thinned from the back side. The invention is applicable not only to CMOS APSs, but to any type of thin sensor, such as silicon strip detectors, or matrix detectors using avalanche photo diode or other thin sensor currently known or to be developed, including semiconductor or non-semiconductor based sensors.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A camera for a transmission electron microscope, including:
    a sensor, the sensor having a thickness of less than 100 μm; and
    a structure positioned below the sensor, the structure configured to reduce the backscattering of electrons toward the sensor to improve resolution of the sensor by reducing noise from backscattered electrons.

2. The camera of claim 1 in which the sensor comprises a CMOS active pixel sensor having a substrate and a detection volume, the structure positioned below the sensor preventing electrons that pass through the substrate from reentering the substrate and reaching the detection volume.

3. The camera of claim 1 in which the structure positioned below the sensor provides an empty space extending a distance below substantially the entire bottom surface of sensor, the distance being at least four times the longer of the length, width, or diameter of the sensor, thereby reducing signals in the sensor caused by electrons backscattered from material below the sensor.

4. The camera of claim 3 in which the sensor has a thickness of less than 50 μm and in which the camera bottom is positioned at least 200 μm from the bottom surface of the sensor.

5. The camera of claim 1 in which the structure positioned below the sensor includes multiple fins, the fins deflecting and absorbing electrons that pass through the sensor.

6. The camera of claim 1 in which the structure positioned below the sensor includes multiple high aspect ratio channels.

7. The camera of claim 5 in which the multiple high aspect ratio channels open toward the sensor.

8. The camera of claim 5 in which the multiple high aspect ratio channels open away from the sensor.

9. The camera of claim 1 in which the structure positioned below the sensor comprises a material having an average atomic number less than that of silicon to reduce the backscattering of electrons.

10. A transmission electron microscope, comprising:
    a source of high energy electrons;
    a focusing column for directing the electrons towards a sample;
    a camera in accordance with any of the above claims for recording an electron image from electrons passed through the sample.

\* \* \* \* \*